(12) United States Patent
Campbell

(10) Patent No.: US 6,462,529 B1
(45) Date of Patent: Oct. 8, 2002

(54) LEGS FOR TRIMMING A TRIPOD WITH AN ELECTRICAL TEST PROBE TIP

(75) Inventor: Julie A. Campbell, Beaverton, OR (US)

(73) Assignee: LeCroy Corporation, Beaverton, OR (US)

(*) Notice: Subject to any disclaimer, the term of this patent is extended or adjusted under 35 U.S.C. 154(b) by 0 days.

(21) Appl. No.: 09/629,016

(22) Filed: Jul. 31, 2000

(51) Int. Cl.[7] .............................................. G01R 31/02
(52) U.S. Cl. ...................................... 324/72.5; 324/754
(58) Field of Search .............................. 324/754, 158.1, 324/230, 72.5; 250/306

(56) References Cited

FOREIGN PATENT DOCUMENTS

EP              232614 A1 * 8/1987 .................. 324/754

* cited by examiner

Primary Examiner—Michael Sherry
Assistant Examiner—Paresh Patel
(74) Attorney, Agent, or Firm—Karen Dana Oster

(57) ABSTRACT

A support device hands-free operation of an electrical test probe having a tip preferably includes at least one support member and an adapter. The adapter is for connecting the support members to the electrical test probe. The support members and the tip of the electrical test probe together form a "tripod" to support the electrical test probe for hands-free operation. The adapter may be an interchangeable connector that may be removed from the support members, a leg integral connector that is permanently attached to the support members, an adaptable connector that is coupleable with different types of probing heads, or an attachment connector that uses an attachment mechanism to attach the probing head to the support members.

13 Claims, 6 Drawing Sheets

LEGS FOR TRIMMING A TRIPOD WITH AN ELECTRICAL TEST PROBE TIP

BACKGROUND OF THE INVENTION

The present invention relates generally to a support device, such as a stand or holder, suitable for hands-free operation of an electrical test probe.

Electrical test probes are used to provide an electrical connection between electrical components and testing instruments such as oscilloscopes and other measuring, monitoring, diagnostic, and signal processing instruments.

An electrical test probe generally consists of a probing head, a cable, and a testing instruments connector. The probing head may have an integral or replaceable probing tip that is suitable for making an electrical contact with electrical components. The testing instrument connector is suitable for connecting to a testing instrument. The probing head is attached to a first end of the cable and the testing instrument connector is attached to the opposite end of the cable.

Traditional test probe tips have a simple, substantially pointed tip. Because the tips must be held in place to maintain contact with leads, legs, or pins (hereinafter "leads") of the electrical components, a user must use at least one hand to place (position and hold) the traditional test probe tip. Accordingly, it would be impossible for a single user to monitor multiple channels and simultaneously make adjustments to an oscilloscope using a traditional test probe tip.

One solution to the problem of positioning test probes is to use alternate tips. Alternate tips such as a grabber tip can be used to grab or grip certain types of electrical components. A securely placed grabber tip, for example, can maintain its position without being held by the user. Grabber tips, however, are less adaptable than traditional test probe tips. They are also more delicate, more expensive, and harder to find than traditional test probe tips.

Another solution to the problem of positioning test probes is known as the PROBE BUDDY™. The PROBE BUDDY™ has a bendable "neck" with a weighted "foot" at one end and a holder at the other end. A user can bend the neck until it is in the correct position to hold the probing tip in electrical contact with the electrical component to be probed. Because of its weight, the foot is positioned off the circuit board. This requires extra space substantially adjacent the circuit board. Further, in actual use the PROBE BUDDY™ is hard to position correctly.

Another problem with using test probes occurs when a difficult connection is finally made and then the circuit board shakes or the user sneezes. If the circuit board is even slightly knocked, the connection is lost. Grabber tips can be used to solve this problem. The PROBE BUDDY™, however, would hold the probing head in place while the circuit board moved, and the connection would be lost. Another solution is the Cascade Microtech Inc. probe holder. The Microtech Inc. probe holder, however, is not really suitable for manual probing, is complicated to use, and is very expensive.

European Patent Application No. 0232614A1 to Janko is directed to a probing head (the "Janko device") having a probe tip and two integral legs that together form a tripod that supports the probing head. The two legs may include nonskid tip surfaces or end pieces or boots made from a soft, nonslip material. The Janko device, however, is extremely limited in that it is an integral unit. In other words, the entire unit must be purchased and used as a whole. Old test probes that are still functional could not take advantage of the legs. Further, if the Janko device did not have a desired tip, the user would be forced to choose a tip Janko did have or not to use the legs. The Janko device is also directed to a downwardly extending tip and legs extending laterally in the same general direction as the tip. This configuration limits the Janko device to uses where the surface to be probed is the upper surface of a component.

BRIEF SUMMARY OF THE INVENTION

A support device of the present invention for hands-free operation of an electrical test probe having a tip preferably includes at least one support member and an adapter. The adapter is for connecting the support members to the electrical test probe. The support members and the tip of the electrical test probe together form a "tripod" to support the electrical test probe for hands-free operation. It should be understood that "tripod" is used throughout the application, but could include the tip plus one or more support members, even if the total number of contact points is more or less than three.

In one alternative preferred embodiment, the support members are independently adjustable in relation to the adapter. Further, the support members may be extensible.

The adapter may be an interchangeable connector that may be removed from the support members, a leg integral connector that is permanently attached to the support members, an adaptable connector that is coupleable with different types of probing heads, or an attachment connector that uses an attachment mechanism to attach the probing head to the support members.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
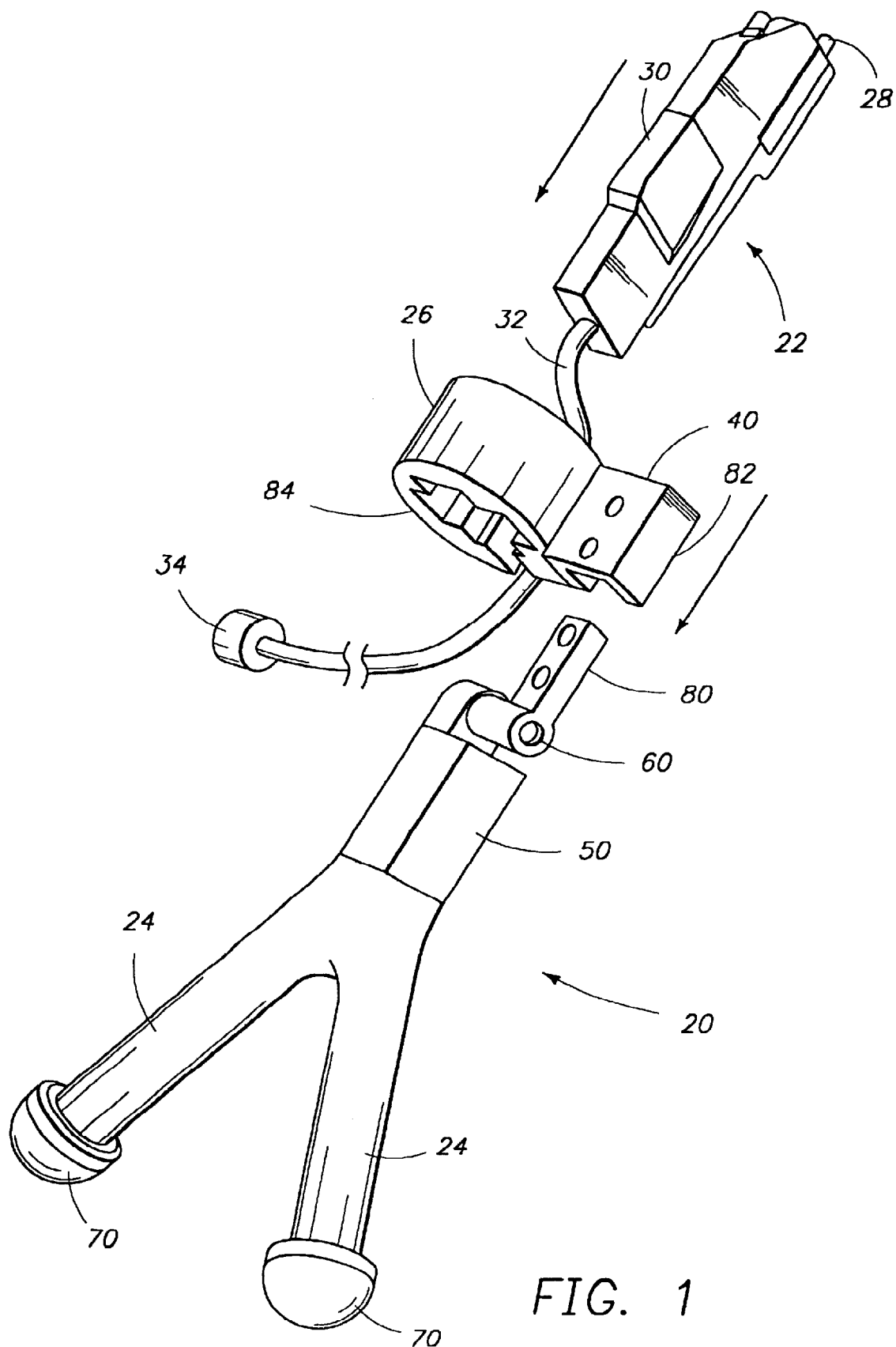
FIG. 1 shows an expanded perspective view of one preferred embodiment of a support device and an exemplary embodiment of a tripod adapter of the present invention.

FIGS. 1–8 show several preferred exemplary embodiments of a probing head support device, stand, or holder (referred to generally as the "support device 20") of the present invention suitable for hands-free operation of an electrical test probe 22. Although there are multiple preferred embodiments of the support device 20, and multiple combinations of the embodiments of the support device 20, they all share several common features. Each embodiment includes at least one support member or leg (referred to generally as the "leg 24") and an attachment device, adapter, or connector mechanism (referred to generally as the "adapter 26") suitable for connecting the legs 24 of the support device 20 to the electrical test probe 22. The support device 20, in most of the embodiments discussed herein, forms a "tripod" between two legs 24 of the support device 20 and a tip 28 of the electrical test probe 22. The tripod is sturdy enough to support the electrical test probe 22 for hands-free operation. In one preferred embodiment the support device 20 is made from a heavy material so that there is sufficient force on the tip 28 to make electrical contact.

Before describing the shown embodiments, each of the elements or features of the support device 20 will be described in detail.

As set forth in the Background of the Invention, an electrical test probe 22 generally consists of a probing head 30, a cable 32, and a testing instrument connector 34. The probing head 30 may have an integral or replaceable probing tip 28 that is suitable for making an electrical contact with electrical components. The probing head 30 is attached to a first end of the cable 32 and the testing instrument connector 34 is attached to the opposite end of the cable 32.

The at least one support member or leg 24 is shown in the figures as a pair of legs. The legs 24 may be an integral pair as shown in FIGS. 1, 3, 6, and 8 or may be independently adjustable such as those shown in FIGS. 2 and 7. It should be noted that a single leg could be used if it was sturdy enough or had a wide enough "foot." Alternatively, more than two legs could be used. Finally, each leg 24 may be a predetermined length or it may have the ability to change lengths. For example, the legs 24 could be extendable or telescoping legs 36 such as those shown in FIG. 7.

The adapter 26 is suitable for connecting the legs 24 of the support device 20 to the electrical test probe 22. Some exemplary types of adapters 26 include an interchangeable connector 40 (FIG. 1) that may be removed from the legs 24 and switched to allow coupling with multiple types of probing heads, a leg integral connector 42 (FIGS. 2, 7, and 8) that is permanently attached to the legs 24, an adaptable connector 44 (FIGS. 3–5) that is designed to couple with various different types of probing heads, and an attachment connector 46 (FIG. 6) that uses an attachment mechanism to attach the probing head to the legs 24. These exemplary adapters 26 are shown in the figures; however, they are meant to be exemplary and are not meant to limit the scope of the invention.

Figure 2:
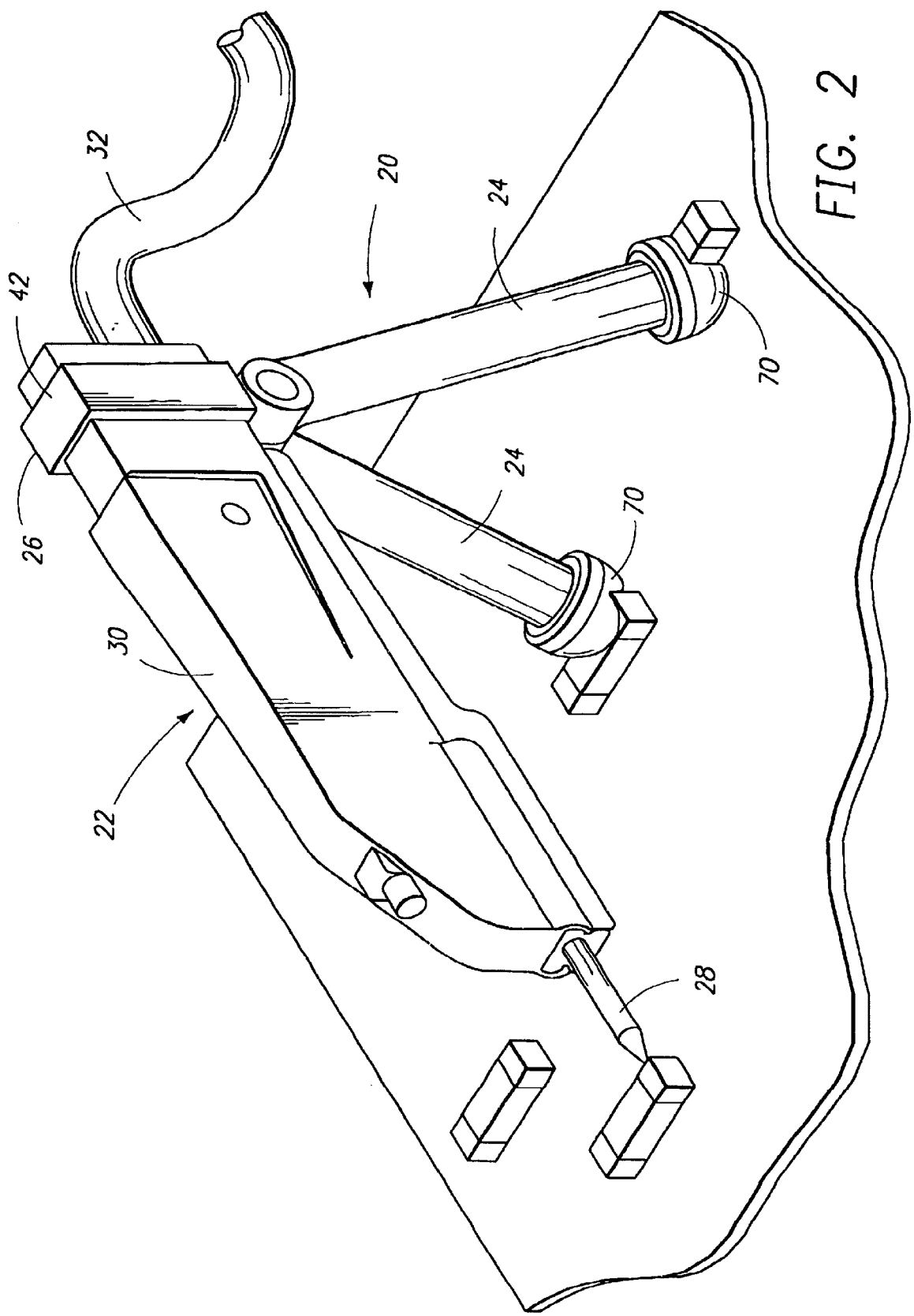
FIG. 2 shows a perspective view of an alternate preferred embodiment of a support device having separately hinged legs and a substantially integral tripod adapter for coupling with a specific probing head.
Figure 3:
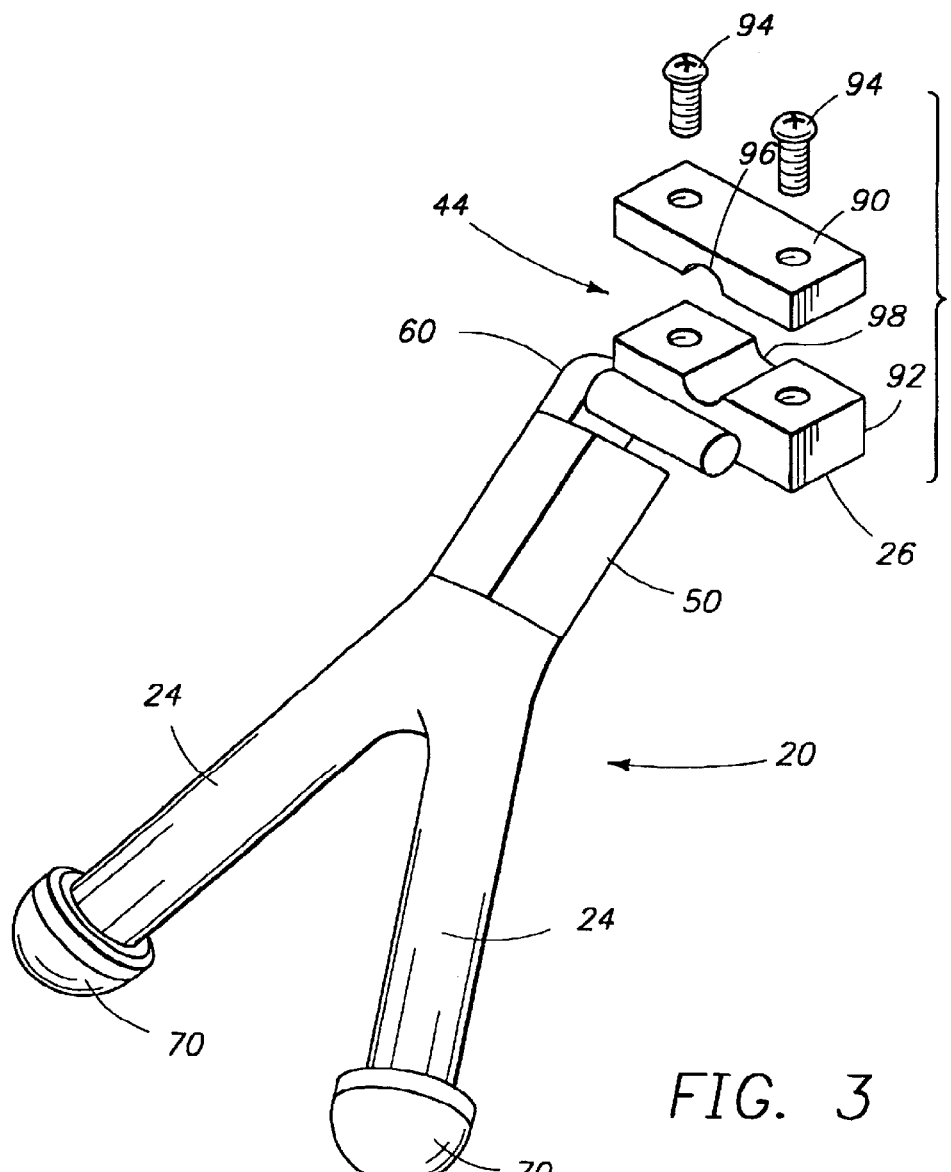
FIG. 3 shows an expanded perspective view of a support device having a substantially integral multi-purpose clamp adapter.
Figure 6:
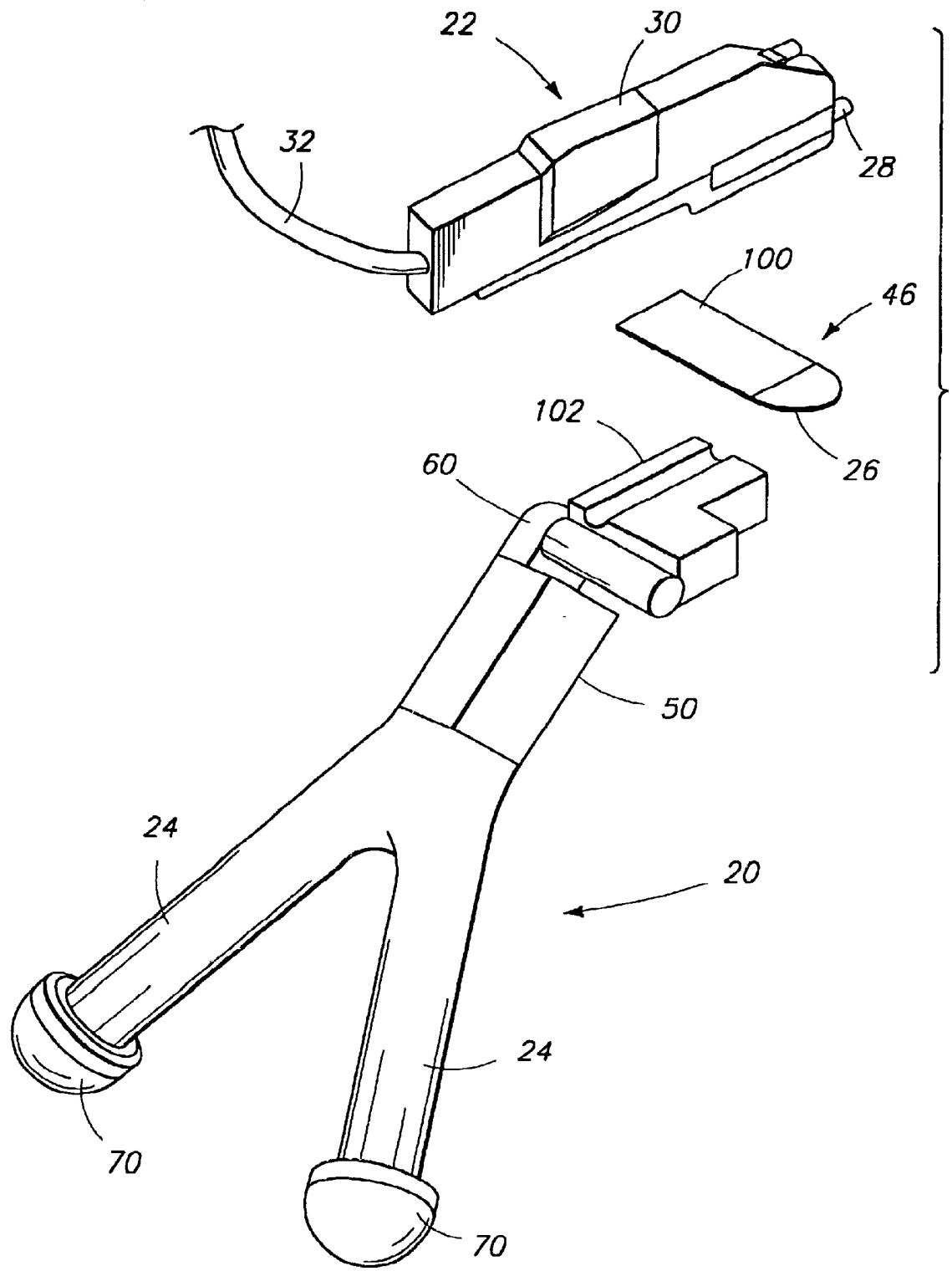
FIG. 6 shows an expanded perspective view of a support device having a surface to which attachment devices may attach a probing head.
Figure 7:
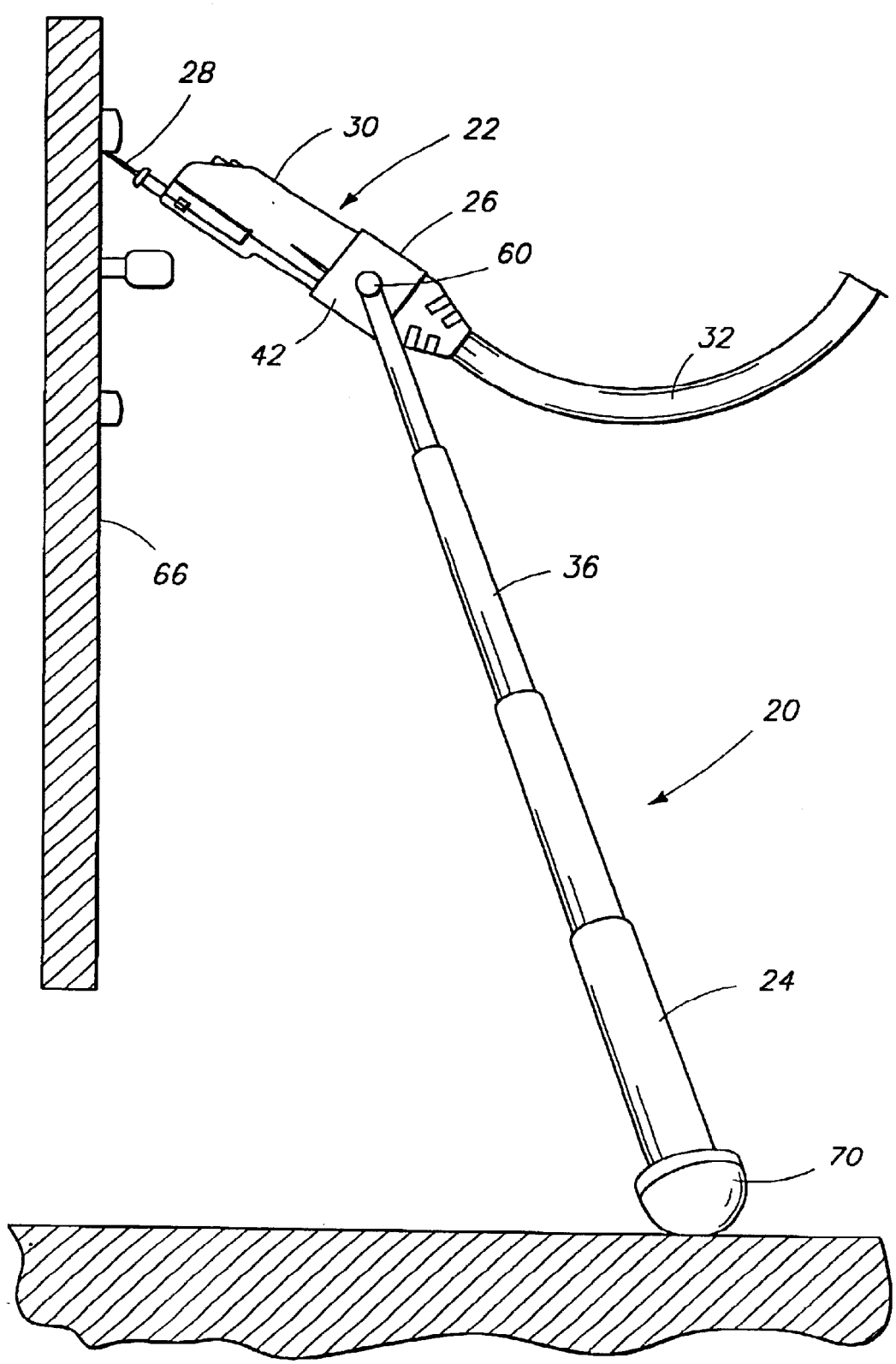
FIG. 7 shows a side view of an alternate preferred embodiment of a support device having separately hinged extensible legs being used to support a probing head as it probes a vertical surface.

The support device 20 may include a body 50 between the legs 24 and the adapter 26. The body 50 may be any predetermined length as shown in FIGS. 1, 3, and 6, an extensible or telescoping body 52 as'shown in FIG. 8, or may not be used at all as shown in FIGS. 2 and 7. Alternate embodiments of the body may include a bendable, shape-retainable member such as a relatively stiff wire that allows flexibility for positioning.

Figure 8:
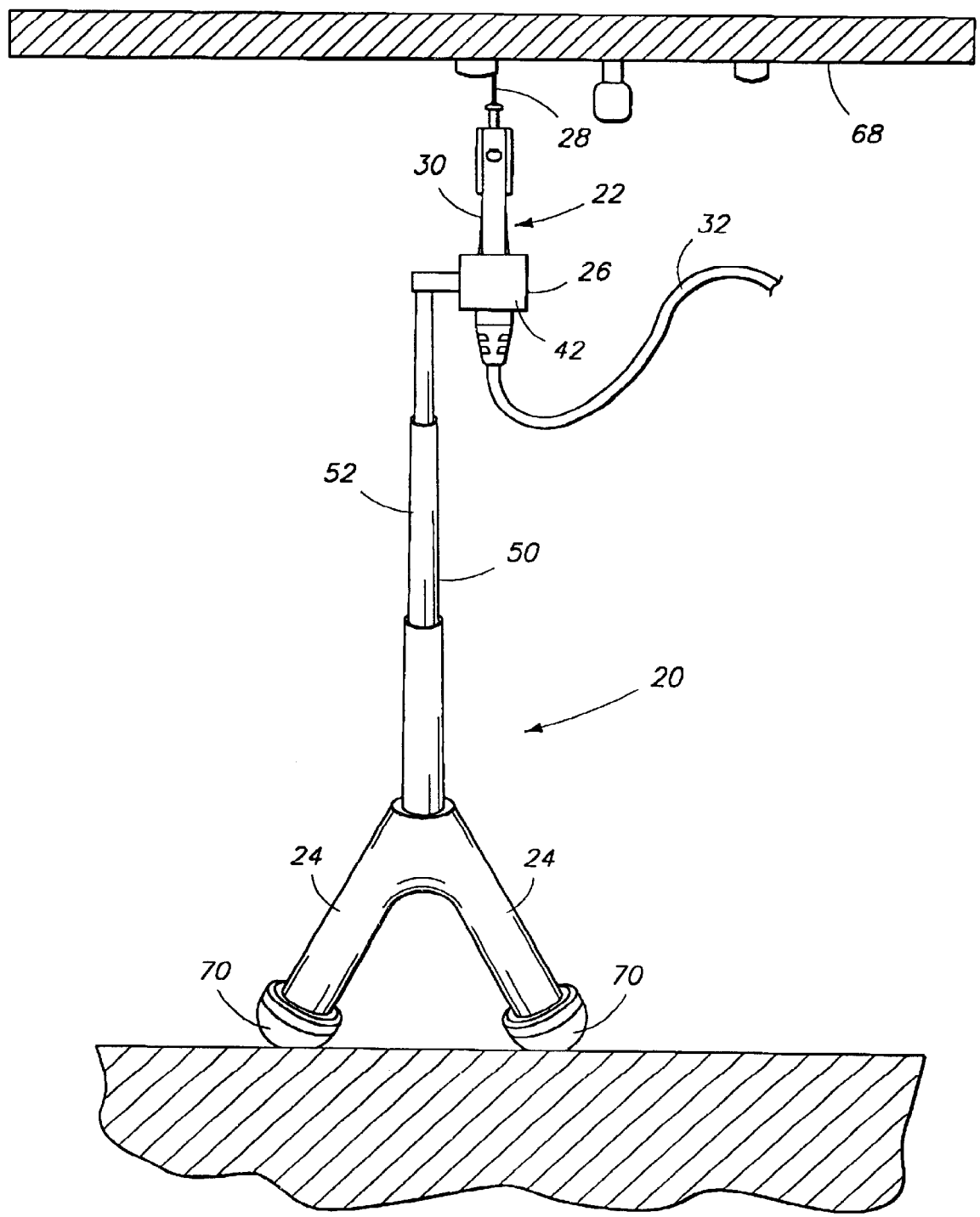
FIG. 8 shows a perspective view of an alternate preferred embodiment of a support device having an extensible body section being used to support a probing head as it probes an overhead horizontal surface.

At least one hinge mechanism 60 may also be included in the support device 20 to allow greater flexibility for positioning the support device 20. This hinge mechanism 60 may take on several forms. For example, a single hinge mechanism 60 may be used as is shown in FIGS. 1, 3, and 6. Multiple hinge mechanisms 60 may be used either for attaching each leg individually (FIG. 2 and FIG. 7) or to allow multiple bends in the legs 24 or the body 50 (not shown). Certain embodiments may be used without hinges; for example, as shown in FIG. 8 there is an adapter 26 at a right angle to the legs 24. The shown hinges are meant to be exemplary. Alternate hinge mechanisms 60 may include ball joints, universal joints, and geared joints.

The legs 24, as set forth above, form a tripod with the tip 28 of the electrical test probe 22. As shown in FIG. 7, the "tripod" could be formed by leaning the tip 28 against a vertical surface 66 substantially perpendicular to the surface on which the legs 24 rest. As shown in FIG. 8, the "tripod" could also be formed by leaning the tip 28 against or pressing the tip 28 upward onto a surface 68 parallel and over the surface on which the legs 24 rest. Other configurations of the "tripod" between the legs 24 and the tip 28 may include irregular, stepped, slanted, gap-spanning, or in-a-crevice configurations.

The end of each leg 24 remote from the adapter 26 may include a foot 70 that is electrically insulated and malleable so that it can rest at almost any point on the circuit board. The feet 70 may be made of soft plastic, rubber, foam, or any other insulating material. The feet 70 can rest on the circuit board because they are electrically insulated (so they won't cause short circuits) and malleable so that they can rest on nonflush components on the circuit board. They may also rest off the circuit board. It should be noted that the feet 70 are optional in that the legs 24 could be made of a nonconductive material or, even if they were made from a conductive material, they could be positioned off of the circuit board.

The embodiments shown in the figures and discussed below are meant to be exemplary. Alternate embodiments may be made by combining one or more of the features discussed.

FIG. 1 shows one preferred embodiment of a support device 20 and an exemplary embodiment of an interchangeable connector 40 of the present invention. The support device 20 includes an integral pair of legs 24 connected by a single hinge mechanism 60 to a connector base 80. The interchangeable connector 40 as shown includes two parts: a base connector 82 and a probe connector 84 designed to be coupleable with one type of probing head 30. The base connector 82 is coupleable to the connector base 80. (Known means of connection such as pins, screws, and tabs may be used, but are not shown.) The probe connector 84 is designed to be coupleable with a rectangular probing head 30 either vertically or horizontally. The interchangeable connector 40 can be removed in its entirety from the legs 24 and replaced with a different interchangeable connector 40 that is coupleable with a different type of probing head 30. For example, the interchangeable connector 40 could be coupleable with a probing head 30 that is circular in cross-section. Alternate embodiments of the interchangeable connector 40 could include a probe connector 84 that could couple with multiple types of probing heads (for example, by making the probe connector with a gripping central section).

The support device 20 of FIG. 1 may be used by selecting an interchangeable connector 40 having a base connector 82 and a first probe connector 84 for connecting to a first type of electrical test probe 22. The base connector 82 is then connected to the connector base 80 and the first probe connector 84 is connected to a first type of electrical test probe 22. A "tripod" is formed to support the first type of electrical test probe 22 for hands-free operation using the legs 24 and the tip 28 of the first type of electrical test probe 22. If the user wants to use a second type of electrical test probe 22, an interchangeable connector 40 having a base connector 82 and a second probe connector 84 for connecting to a second type of electrical test probe 22 is selected. Then the base connector 82 is connected to the connector base 80 and the second probe connector 82 is connected to a second type of electrical test probe 22. A "tripod" is formed to support the second type of electrical test probe 22 for hands-free operation using the legs 24 and the tip 28 of the second type of electrical test probe 22.

FIG. 2 shows an alternate preferred embodiment of a support device 20 having separately hinged legs 24 and a substantially leg integral connector 42 for coupling with a specific probing head 30. The exemplary legs 24 are shown as independently adjustable. The adapter 26 is a leg integral connector 42 that is simply slid (or otherwise connected) onto the probing head 30. Although it is shown as being suitable to connect with a probing head 30 with a rectangular cross-section, alternate designs could be connectable with probing heads 30 that are circular (or other shaped) in cross section or adaptable to multiple types of probing heads 30. This support device 20 would be particularly suitable for a user who usually does not need a support device 20, but occasionally wants to quickly attach the support device 20. As shown in this embodiment, the feet 70 can rest on the circuit board because they are electrically insulated (so they won't cause short circuits) and malleable so that they can rest on nonflush components on the circuit board.

Figure 4:
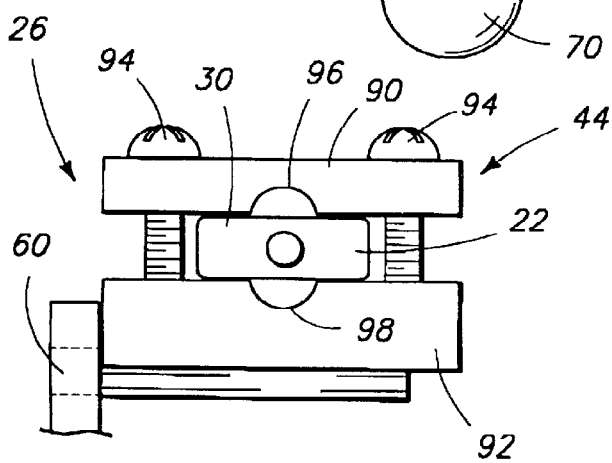
FIG. 4 shows a cross-sectional view of the multi-purpose clamp adapter of FIG. 3 supporting a substantially rectangular probing head.
Figure 5:
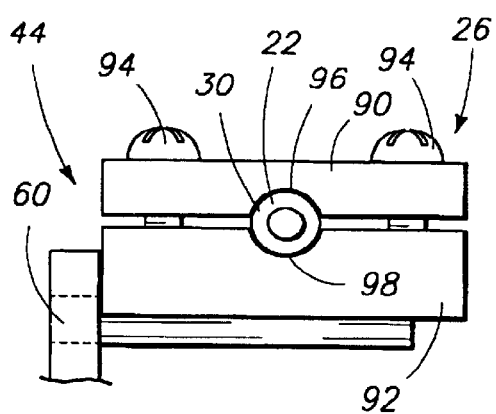
FIG. 5 shows a cross-sectional view of the multi-purpose clamp adapter of FIG. 3 supporting a substantially circular probing head.

FIGS. 3–5 show a support device 20 having a substantially integral multi-purpose clamp adapter or adaptable connector 44. The exemplary legs 24 are shown as an integral pair. FIGS. 4 and 5 show an enlarged adaptable connector 44 that can be adapted to couple with different types of probing heads such as a rectangular probing head 30 (FIG. 4) or a circular probing head 30 (FIG. 5). In this embodiment there is an upper clamp 90 and a lower clamp 92 that may be connected by at least one clamp connector 94 (shown as a pair of bolts). The upper and lower clamps 90, 92 each have a circular indentation 96, 98. As shown in FIG. 4, a probing head 30 with a rectangular cross-section can be laid between the upper and lower clamps 90, 92 and secured therebetween using the clamp connectors 94. As shown in FIG. 5, a probing head 30 with a circular cross-section can be laid between circular indentations 96, 98 of the upper and lower clamps 90, 92 and secured therebetween using the clamp connectors 94. One type of alternative adaptable connector 44 could use an alternative clamp connector such as a strap, elastic band, tie wraps, or cable ties. Another type of alternative adaptable connector 44 could use upper and lower clamps 90, 92 that are connected using hinges, stretching members, or semi-permanent adhesive. Still another type of alternative adaptable connector 44 could have a flexible or malleable upper and/or lower clamp 90, 92 either with or without circular indentations 96, 98 so that the clamps 90, 92 mold around the probing head 30. Yet another type of alternative adaptable connector 44 could have a relatively stiff exterior frame with a plurality of flexible or malleable fingers pointed inward toward the center of the frame so that the probing head 30 can be inserted between the fingers and held therein. Another alternative would be a rubber gasket that conforms to hold the probe head. These alternative adaptable connectors 44 are meant to be exemplary and are not meant to limit the scope of the invention.

FIG. 6 shows a support device 20 having an attachment connector 46 that uses an at least one attachment mechanism 100 to connect the probing head 30 to a surface 102. The shown attachment mechanism 100 is a double-sided adhesive strip that preferably is easily removable. One type of double-sided adhesive strip is COMMAND ADHESIVE™ produced by 3M. Another type of attachment mechanism may be a hook and loop fabric such as VELCRO® where the hook fabric is attached to either the bottom surface of the probing head 30 or the top of the surface 102 and the loop fabric is attached to the opposite surface. Another type of attachment mechanism may be a mechanical connector such as a snap, button, hook and eye, or other device where the one side of the mechanical connector is attached to either the bottom surface of the probing head 30 or the top of the surface 102 and the other side of the mechanical connector is attached to the opposite surface. Other types of attachment mechanisms 102 include magnets and removable or permanent adhesive. These alternative attachment mechanisms 102 are meant to be exemplary and are not meant to limit the scope of the invention.

FIG. 7 shows a support device 20 having separately hinged extensible or telescoping legs 36 being used to support a probing head 30 as it probes components on a vertical surface 66. The legs 36 are shown as independently hinged on opposite sides of a leg integral connector 42. The telescoping legs 36 provide additional flexibility by allowing the probing head 30 to be raised and lowered to probe components at varying heights on a vertical surface. Alternative embodiments of this support device could have an interchangeable connector 40, an adaptable connector 44, or an attachment connector 46. The legs could also be non-extensible, bendable, or have multiple hinges thereon. Although no body 50 is shown, alternate embodiments could include a body 50.

FIG. 8 shows a tripod formed by leaning the tip 28 against or pressing the tip 28 upward onto a surface 68 substantially parallel and over the surface on which the legs 24 rest. The shown support device 20 has an extensible or telescoping body 52 used to support a probing head 30 as it probes the overhead horizontal surface 68. The exemplary legs 24 are shown as an integral pair. The exemplary adapter 26 is shown as a leg integral connector 42. As shown there is no hinge in this embodiment. Instead, the adapter 26 is at a right angle to the legs 24. Alternative embodiments of this support device could have an interchangeable connector 40, an adaptable connector 44, or an attachment connector 46. The legs could also be extensible, bendable, or have multiple hinges thereon. The extensible body 52 may be replaced with an alternate body 50 particularly if the legs are extensible.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A support device for hands free operation of an electrical test probe having a tip, said support device comprising:

(a) at least one support member;

(b) an adapter for connecting said at least one support member to said electrical test probe;

(c) said adapter being an interchangeable connector that may be removed from said at least one support member; and (d) said at least one support member and said tip of said electrical test probe together suitable for forming a "tripod" to support said electrical test probe for hands-free operation.

2. The support device of claim 1, said at least one support member being extensible.

3. The support device of claim 1, said adapter being an adaptable connector that is coupleable with different types of probing heads.

4. The support device of claim 1, said adapter being an attachment connector that uses at least one attachment mechanism to attach said probing head to at least one support member.

5. The support device of claim 1 further comprising a body between said adapter and said at least one support member.

6. The support device of claim 5 wherein said body is extensible.

7. The support device of claim 1 further comprising at least one hinge mechanism between said adapter and said at least one support member.

8. The support device of claim 1, further comprising a non-slip foot on each at least one support member, said non-slip foot positioned opposite said adapter.

9. A method for hands-free operation of electrical test probes having a tip, said method comprising the steps of:

(a) providing at least one support member with a connector base;

(b) selecting an interchangeable connector having a base connector and a first probe connector for connecting to a first type of electrical test probe;

(c) connecting said base connector to said connector base of said at least one support member;

(d) connecting said first probe connector to a first type of electrical test probe; and (e) forming a "tripod" to support said first type of electrical test probe for hands-free operation using said at least one support member and said tip of said first type of electrical test probe.

10. The method of claim 9 further comprising the steps of:

(a) selecting an interchangeable connector having a base connector and a second probe connector for connecting to a second type of electrical test probe;

(b) connecting said base connector to said connector base of said at least one support member;

(c) connecting said second probe connector to a second type of electrical test probe; and (d) forming a "tripod" to support said second type of electrical test probe for hands-free operation using said at least one support member and said tip of said second type of electrical test probe.

11. A support device for hands-free operation of an electrical test probe having a tip, said support device comprising:

(a) at least one support member;

(b) an adapter for connecting said at least one support member to said electrical test probe;

(c) said at least one support member and said tip of said electrical test probe together suitable for forming a "tripod" to support said electrical test probe for hands-free operation;

(d) said support device further comprising at least one of the features selected from a group consisting of:

(i) said adapter being an interchangeable connector that may be removed from said at least one support member;

(ii) said at least one support member being extensible;

(iii) said adapter being an adaptable connector that is coupleable with different types of probing heads;

(iv) said adapter being an attachment connector that uses at least one attachment mechanism to attach said probing head to at least one support member;

(v) a body between said adapter and said at least one support member;

(vi) an extensible body between said adapter and said at least one support member; and (vii) at least one hinge mechanism between said adapter and said at least one support member.

12. The support device of claim 11, wherein at least one support member is a pair of legs.

13. The support device of claim 11, wherein at least one support member is independently adjustable in relation to said adapter.

* * * * *

UNITED STATES PATENT AND TRADEMARK OFFICE
CERTIFICATE OF CORRECTION

PATENT NO. : 6,462,529 B1  
DATED : October 8, 2002  
INVENTOR(S) : Campbell

It is certified that error appears in the above-identified patent and that said Letters Patent is hereby corrected as shown below:

Title page, Item [54] and Column 1, lines 1-2,
Title, should read:
-- LEGS FOR FORMING A TRIPOD WITH AN ELECTRICAL TEST PROBE TIP --

Signed and Sealed this

Eleventh Day of May, 2004

JON W. DUDAS
*Acting Director of the United States Patent and Trademark Office*